US011322806B2

(12) United States Patent
Riemer et al.

(10) Patent No.: US 11,322,806 B2
(45) Date of Patent: May 3, 2022

(54) SENSORED BATTERY ELECTRODE

(71) Applicant: Hutchinson Technology Incorporated, Hutchinson, MN (US)

(72) Inventors: Douglas P. Riemer, Waconia, MN (US); Michael W. Davis, Rockford, MN (US); Peter F. Ladwig, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 17/017,523

(22) Filed: Sep. 10, 2020

(65) Prior Publication Data

US 2021/0083258 A1 Mar. 18, 2021

Related U.S. Application Data

(60) Provisional application No. 62/901,162, filed on Sep. 16, 2019, provisional application No. 62/900,419, filed on Sep. 13, 2019.

(51) Int. Cl.
*H01M 50/531* (2021.01)
*H01M 10/48* (2006.01)
*G01R 31/36* (2020.01)
*G01K 7/16* (2006.01)
*G01L 9/04* (2006.01)
*G01L 9/12* (2006.01)
*G01K 1/02* (2021.01)

(52) U.S. Cl.
CPC ......... *H01M 50/531* (2021.01); *G01K 1/026* (2013.01); *G01K 7/16* (2013.01); *G01L 9/04* (2013.01); *G01L 9/12* (2013.01); *G01R 31/36* (2013.01); *H01M 10/48* (2013.01); *H01M 10/486* (2013.01)

(58) Field of Classification Search
CPC ...... H01M 2/26; H01M 10/486; H01M 10/48; G01R 31/36; G01K 1/026; G01K 7/16; G01L 9/04; G01L 9/12
See application file for complete search history.

(56) References Cited

U.S. PATENT DOCUMENTS

| 8,133,604 | B1 | 3/2012 | Nakahara et al. | |
| 2003/0211425 | A1 | 11/2003 | Mao et al. | |
| 2009/0239130 | A1* | 9/2009 | Culver | H01M 10/052 429/50 |
| 2013/0004811 | A1 | 1/2013 | Banerjee et al. | |

(Continued)

FOREIGN PATENT DOCUMENTS

| CN | 102439430 B | * | 8/2013 | ........... G01N 27/223 |
| CN | 104900932 A | * | 9/2015 | |

(Continued)

OTHER PUBLICATIONS

International Search Report and Written Opinion in International Application No. PCT/US2020/050561, dated Feb. 4, 2021.

(Continued)

*Primary Examiner* — Jonathan M Dunlap
(74) *Attorney, Agent, or Firm* — DLA Piper LLP (US)

(57) ABSTRACT

An electrode tab is described. The electrode tab including a base layer and an outer layer disposed on the base layer. The base layer including a sensor.

18 Claims, 12 Drawing Sheets

(56) References Cited

U.S. PATENT DOCUMENTS

| | | | |
|---|---|---|---|
| 2013/0143084 A1* | 6/2013 | Kim | H01M 2/0207 |
| | | | 429/90 |
| 2013/0323542 A1 | 12/2013 | Wijayawardhana et al. | |
| 2013/0323554 A1* | 12/2013 | Heubner | H01M 10/0587 |
| | | | 429/91 |
| 2014/0092375 A1* | 4/2014 | Raghavan | H01M 10/48 |
| | | | 356/32 |
| 2014/0199581 A1 | 7/2014 | Ryu et al. | |
| 2014/0312911 A1* | 10/2014 | Ding | H01M 10/48 |
| | | | 324/426 |
| 2014/0370338 A1 | 12/2014 | Lim | |
| 2015/0111077 A1* | 4/2015 | Paik | C25D 7/04 |
| | | | 429/91 |
| 2015/0171489 A1* | 6/2015 | Inaba | G01R 31/3644 |
| | | | 429/61 |
| 2016/0050750 A1 | 2/2016 | Rogers et al. | |
| 2017/0077487 A1 | 3/2017 | Coakley et al. | |
| 2017/0208686 A1 | 7/2017 | Fukuchi | |
| 2017/0219443 A1* | 8/2017 | Davis | G01L 1/2268 |
| 2018/0316067 A1* | 11/2018 | Schwarzberger | H01M 10/448 |
| 2020/0076016 A1 | 3/2020 | Riemer et al. | |
| 2020/0313152 A1* | 10/2020 | Stefanopoulou | H01M 2/345 |
| 2021/0083257 A1 | 3/2021 | Riemer et al. | |

FOREIGN PATENT DOCUMENTS

| | | | |
|---|---|---|---|
| CN | 106159364 A | * | 11/2016 |
| CN | 107026282 A | * | 8/2017 |
| CN | 108987659 A | * | 12/2018 |
| CN | 109065961 A | * | 12/2018 |
| IN | 201741021696 A | | 12/2018 |
| JP | 2014225406 A | * | 12/2014 |
| WO | WO 2016/108888 A1 | | 7/2016 |
| WO | WO 2017/087807 A1 | | 5/2017 |
| WO | WO-2019146960 A1 | * | 8/2019 ............... G01L 1/14 |

OTHER PUBLICATIONS

International Search Report and Written Opinion in International Application No. PCT/US2020/050558, dated Mar. 11, 2021.
Corrected International Search Report in International Application No. PCT/US2020/050558, dated Jun. 17, 2021.

* cited by examiner

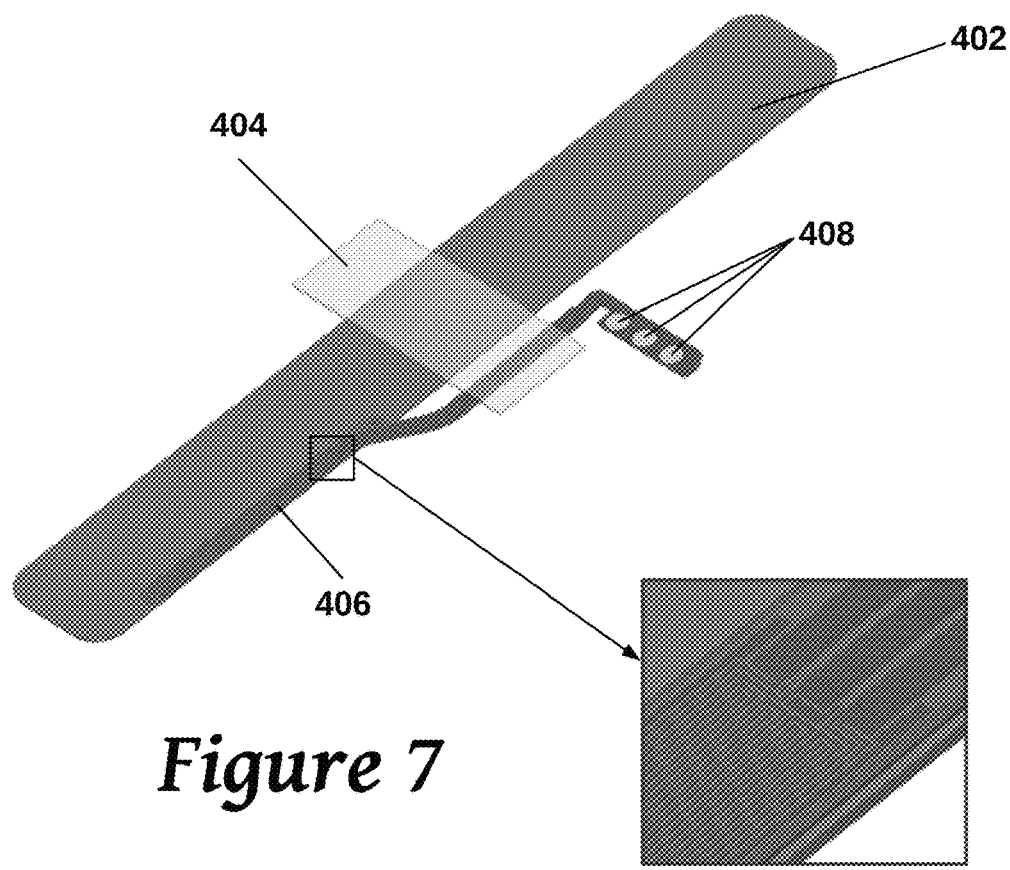
*Figure 7*
*Figure 8*
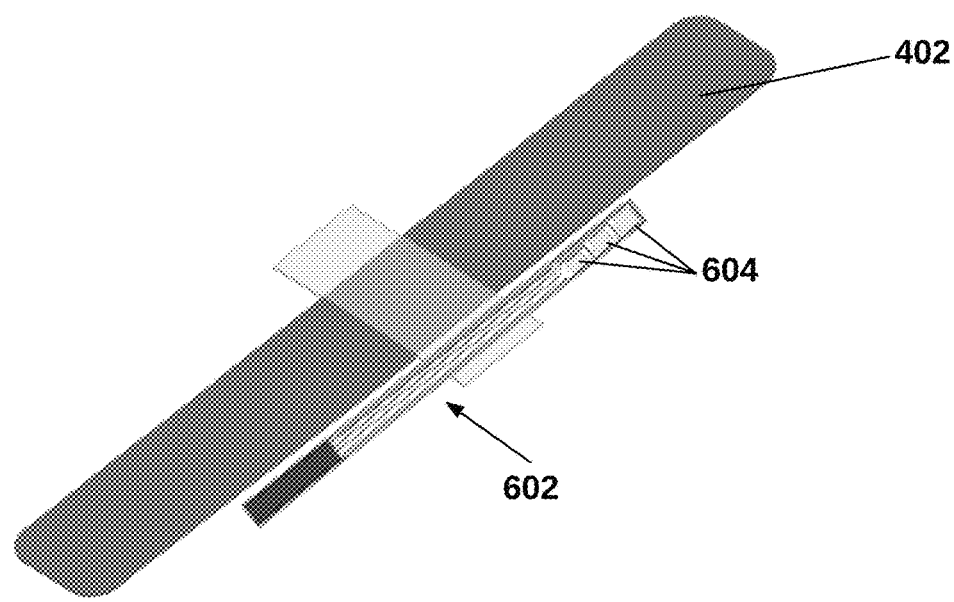
*Figure 9*

SENSORED BATTERY ELECTRODE

CROSS-REFERENCE TO RELATED APPLICATIONS

This application claims priority from U.S. Provisional Patent Application No. 62/900,419, filed on Sep. 13, 2019, and U.S. Provisional Patent Application No. 62/901,162, filed on Sep. 16, 2019, each of which is hereby incorporated by reference in their entirety.

FIELD

Embodiments of the invention relate to batteries. In particular, embodiments of the invention relate generally to sensors for batteries.

BACKGROUND

Batteries are critical for the operation of the many devices including, automobiles, medical devices, mobile electronic devices, and the like. As devices become more sophisticated, the demand on the batteries increases and the operating characteristics of the battery become more important. To more efficiency provide power to devices, it is desirable to reduce charging times and increase capacity without damaging batteries or reducing their lifespan. By more precisely detecting and controlling the operating characteristics of a battery, it is possible to impact the life of a battery and the operation of the devices that rely on the battery.

SUMMARY

An electrode tab is described. The electrode tab including a base layer having an outer layer formed over each side of the base layer. The base layer including a sensor.

Other features and advantages of embodiments of the present invention will be apparent from the accompanying drawings and from the detailed description that follows.

BRIEF DESCRIPTION OF THE DRAWINGS

Embodiments of the present invention are illustrated by way of example and not limitation in the figures of the accompanying drawings, in which like references indicate similar elements and in which:

FIG. 7 illustrates a sensored electrode tab according to an embodiment;

FIG. 8 illustrates a temperature sensor according to an embodiment;

FIG. 9 illustrates a sensored electrode tab according to an embodiment;

DETAILED DESCRIPTION

Figure 1:
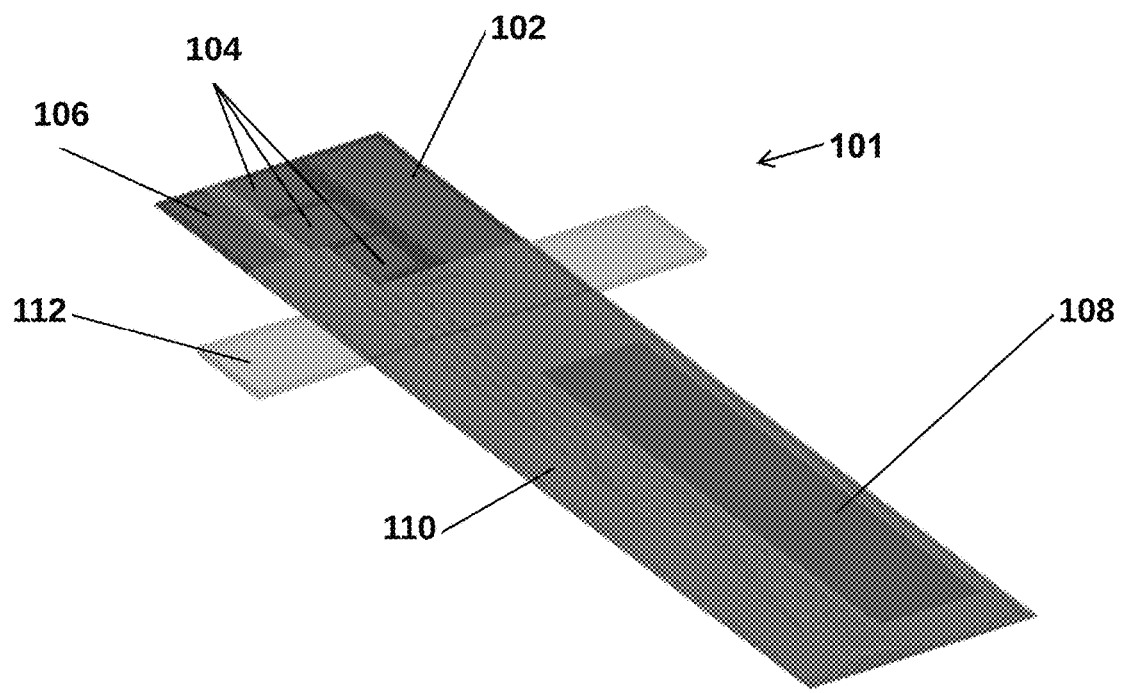
FIG. 1 illustrates a sensored electrode tab according to an embodiment.
Figure 2:
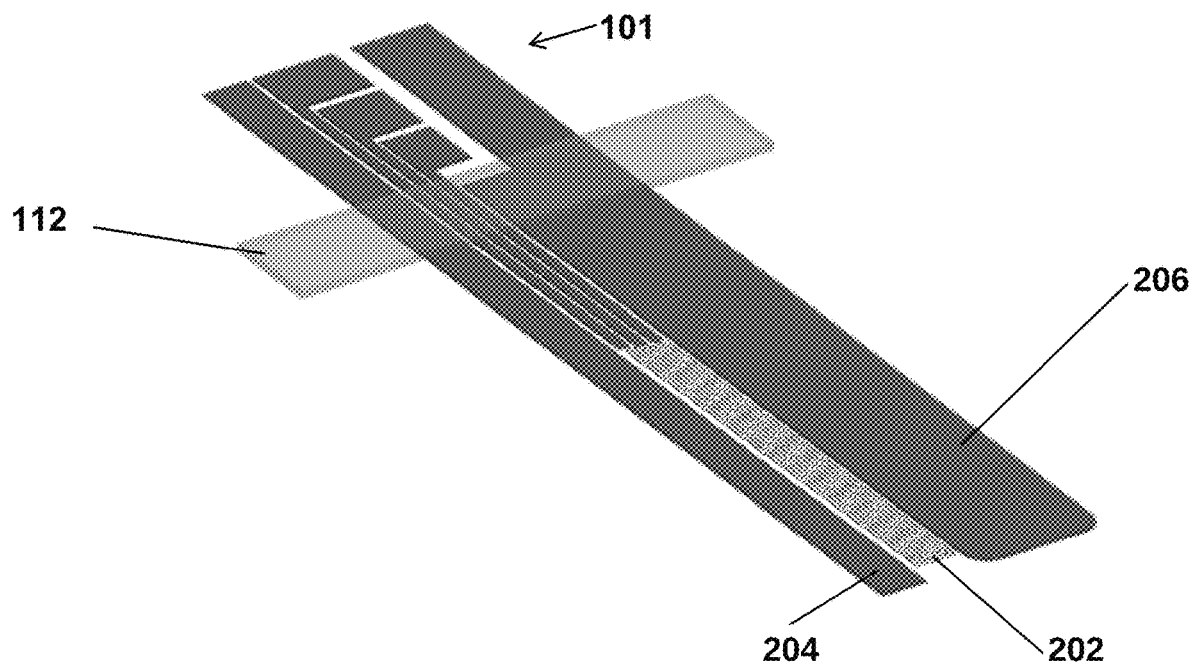
FIG. 2 illustrates a sensored electrode tab according to an embodiment.
Figure 3:
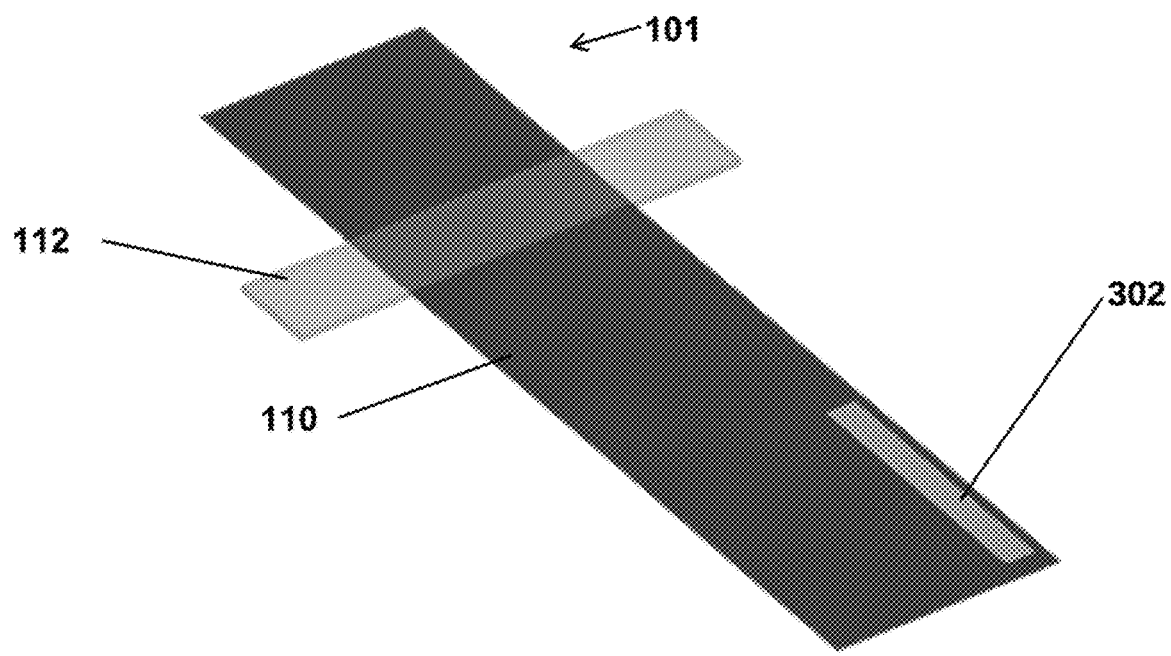
FIG. 3 illustrates a sensored electrode tab according to an embodiment.
Figure 4:
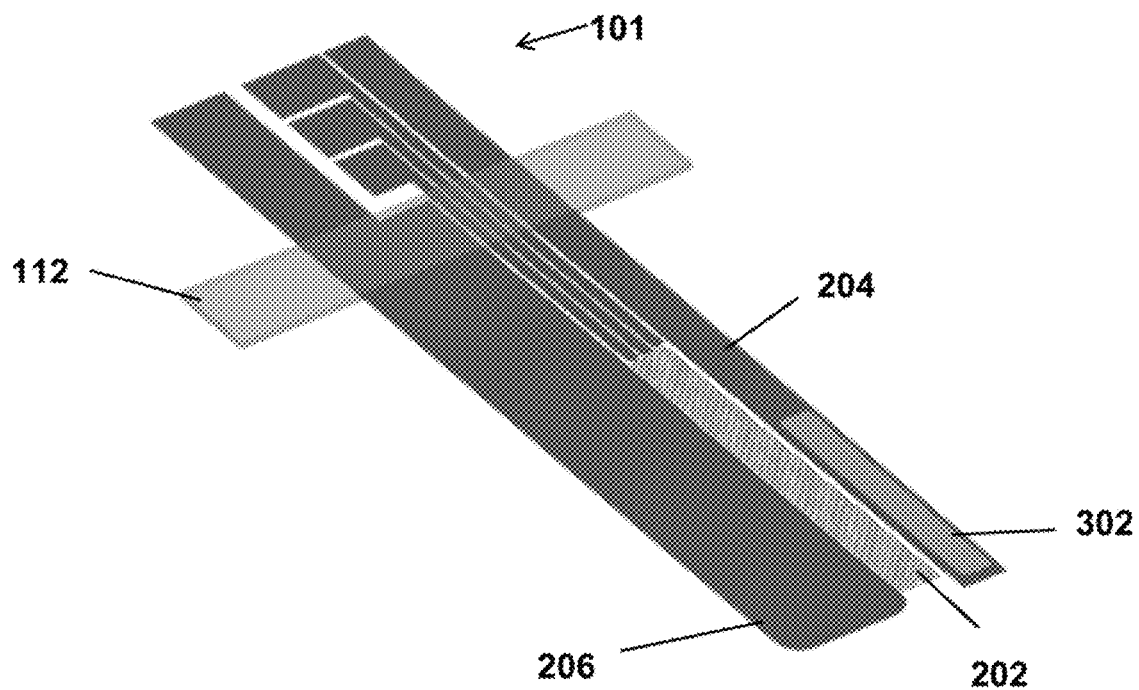
FIG. 4 illustrates a sensored electrode tab according to an embodiment.

A sensored electrode tab and methods of manufacturing in accordance with embodiments of the invention are described. The sensored electrode tab enables access to sensor information including temperature, voltage, capacitance, and the like to a power management system connected to a battery. Embodiments of the sensored electrode tab are configured to be used with battery types including, but not limited to, cylindrical batteries (e.g., jelly roll), pouch batteries, and other battery configurations. In various embodiments, the sensored electrode tab may be inserted in the electrolyte of a battery to provide sensor information for the inside of the battery at the electrode points where the battery is charged and/or discharged. Power management systems by use this sensor information to regulate battery temperature, charging rate, charging time, and the like to improve battery performance.

FIG. 1-4 illustrate a sensored electrode tab according to an embodiment. The electrode tab 101 includes one or more features such as one or more sensors 202, a reference electrode 204, and a battery electrode interface 206 integrated into a one piece construction. The sensored electrode tab 101 includes a first outer layer 110 formed over a base material. The outer layer 110 may be a polymer film. In various embodiments, the outer layer 110 is a dielectric polymer film including a layer of polyimide. The outer layer 110 may be formed over the base material to expose a battery electrode terminal 102, one or more sensor terminals 104, a reference electrode terminal 106, and a battery electrode interface 108. The base material may be a metal or dielectric material.

Figure 5:
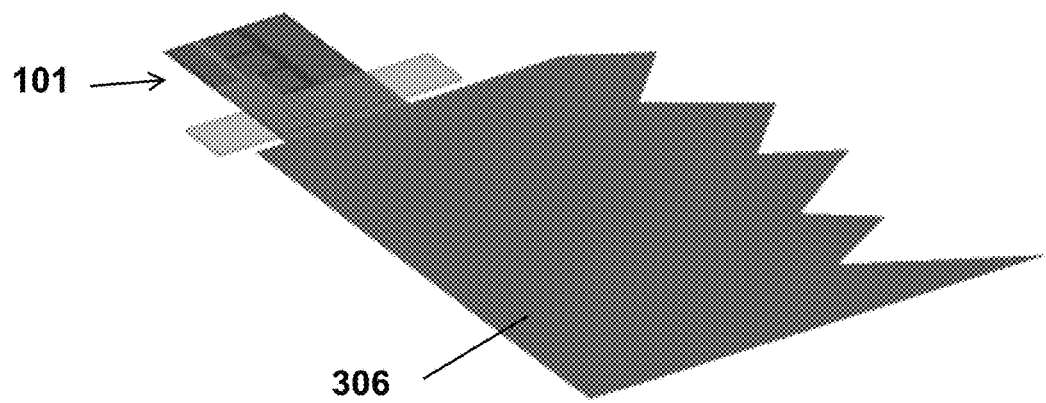
FIG. 5 illustrates a sensored electrode tab attached to one aspect of a battery according to an embodiment.
Figure 6:
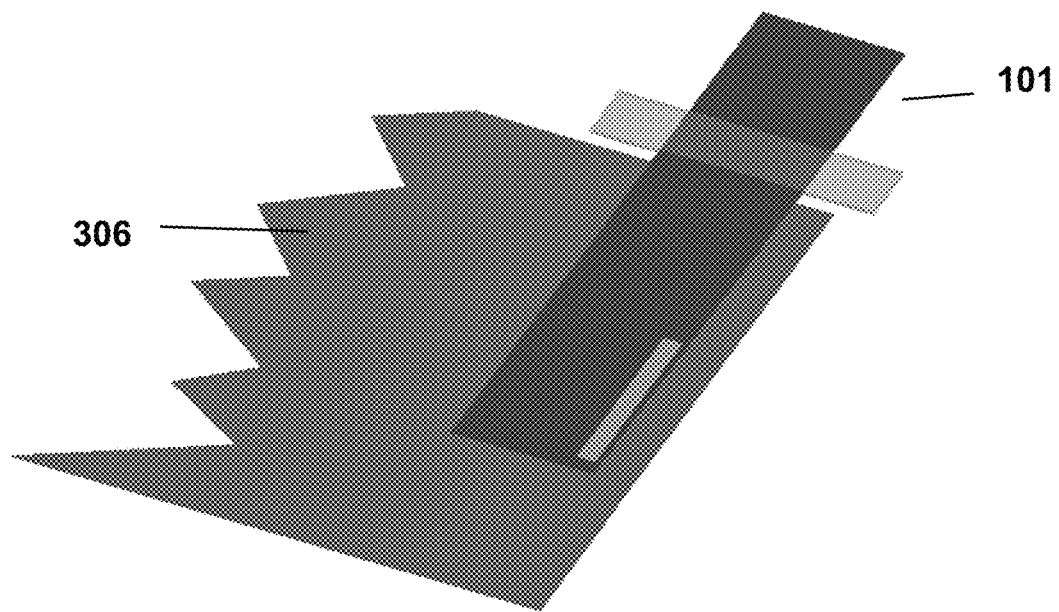
FIG. 6 illustrates a sensored electrode tab attached to one aspect of a battery according to an embodiment.

The battery electrode terminal 102 and battery electrode interface 108 interface with a battery electrode. In various embodiments, the battery electrode interface 108 is included inside an assembled battery and the battery electrode terminal 102 is external to the battery. As shown in FIGS. 5-6, the battery electrode interface 108 is bonded to copper battery foil 306 or another component of the battery. The one or more sensor terminals 104 is configured to couple the one or more sensors 202 included in the electrode tab 101 with a power management system to enable access to sensor information about the battery. The reference electrode terminal 106 is configured to couple a reference electrode 302 with a power management system to enable access to sensor information about the battery. In various embodiments, the reference electrode 204 is configured to be positioned inside an assembled battery to provide chemical, voltage, and other sensor information.

The one or more sensors 202, according to various embodiments, are formed on the base material. In various embodiments, the one or more sensors 202 are formed on the base material of the electrode tab 101 using deposition and etch techniques including those known in the art. In various embodiments, the one or more sensors 202 are formed on a film separated from the electrode tab 101 and affixed to the electrode tab 101. For example, the one or more sensors 202 are formed on a film and affixed to the electrode tab 101 using laminating techniques or an adhesive. FIGS. 7 and 9 below illustrate embodiments with the one or more sensors 202 formed on a film separated from the electrode tab 101.

For some embodiments, the sensors 202 are configured as an array of multiple sensors. The sensors 202 are connected to one or more electrical traces and electrically coupled with the one or more sensor terminals 104. The sensor terminals 104 may include electrical contacts, for example, but not limited to, contact pads, zero insertion force connections, or other styles to make electrical communication with another circuit. The sensor terminals are configured to extend beyond the outer layer 102, according to some embodiments, so that the sensors 202 can be in electrical communication with one or more circuits outside of a battery. The one or more circuits could include, but are not limited to, control circuits and monitoring circuits. For example, the one or more circuits outside the battery could be configured to optimize the performance of the battery.

The one or more sensors 202 disposed on a base material of an electrode tab can include, but is not limited to, a temperature sensor, a strain gauge, and a capacitance sensor. A strain gauge is configured to provide internal pressure detection of one or more sections within the battery. For example, one or more strain gauges can be used to determine gas generation within the battery that can result in a bulging battery. The gases are produced due to electro-chemical oxidation of the electrolyte. Such oxidation occurs usually due to overcharging of the battery due to a faulty battery or faulty charging electronics in device or battery charger. A capacitance sensor is configured to provide internal pressure detection of one or more sections within the battery. A capacitance sensor can be used to determine gas generation within a battery as described herein.

A temperature sensor includes, but is not limited to, a resistance temperature detector, a thermocouple, a thermopile, and a thermistor. The temperature sensor is configured to provide temperature information of one or more sections of a battery cell formed within the battery. One or more types of a sensor, according to some embodiments, are formed in an array so that one or more types of a sensor are configured to provide information about different sections of a battery cell in contact or in proximity to the battery cell electrode. In various embodiments, the one or more sensors can be dual or redundant for reliability and increased error detection. The one or more sensors can operate independent of integrated resistors or gauges, for example, but not limited to, a Wheatstone bridge circuit sensing resistance. In various embodiments, the one or more sensors, such as an RTD, may be configured to function as a heater to warm up one or more areas of the battery to improve battery performance.

One skilled in the art will recognize the one or more sensors 202 described herein could be used in a variety of applications including chemical sensing, biometric sensing, fuel cells, energy harvesters, drug delivery devices, microfluidic devices, micromanipulators, microactuators, solar cells, and organic LEDs, LEDs, and other displays. The one or more sensors 202 may be particular to a particular battery cell, battery, or battery stack. Including electrode tabs with one or more sensors in battery cells of each battery in a battery stack, can increase resolution of battery stack performance by enabling access to sensor information indicative of the performance of each cell within the battery stack.

In various embodiments, the one or more sensors 202 can be integrated with a reference electrode 302. The referenced electrode 302 is configure to be electrically isolated from the battery electrode and/or current collectors and may be fabricated to chemically match the electrolyte included in the battery. In various embodiments, the reference electrode 302 is configured to be exposed on the backside of the electrode tab opposite the battery electrode interface 108 to prevent the reference electrode from shorting directly to the battery cell. The reference electrode 302 may be exposed by, for example, etching, laser ablation, and the like, of the base material and/or deposition of a dielectric layer, for example, a polyimide layer.

The reference electrode may be a conductive metal, for example, copper, nickel plated copper, and the like. In various embodiments, the reference electrode 302 may be plated with an alternative metal and/or metal oxide substance, for example, gold, silver, platinum, iridium, iridium oxide (IrOX), aluminum, and the like. The reference electrode may be plated with a Lithium Metal Oxide composition (LiMOx), for example, Lithium Cobalt Oxide (LiCoO$_2$), Lithium Iron Phosphate (FeLiO$_4$P), and the like. The reference electrode 302 may be assembled inside the battery and may be in contact with the electrolyte to enable access to chemical sensor information about a battery cell. Chemical sensor information may include the presence and/or characteristics of a film or other substance deposited on the reference matching the composition of the electrolyte or a substance that may be electrochemically synthesized from the electrolyte. In various embodiments, the reference electrode 302 includes a counter electrode for passing current to the reference electrode 302 to sense internal batter resistance and/or impedance.

FIG. 7 illustrates a sensored electrode tab according to one embodiment. The sensored electrode tab includes one or more sensors 406 fixed to an electrode 402. The electrode 402 is a thin metal electrode, for example, a nickel or copper electrode. In various embodiments, a copper electrode may be plated with a metal that is less conductive than copper, for example, nickel. The electrode 402 is between 2-10 mm wide and 50-200 microns (μm) thick, according to some embodiments. In various embodiments, the electrode 402 is 6 mm wide and 80 μm thick. The electrode 402 may include one or more zones for attaching the electrode 402 to the battery. In various embodiments, the electrode affixes to the battery by bonding the electrode to a copper foil using heat, for example, ultrasonic bonding, laser welding, and the like.

FIG. 8 illustrates a temperature sensor according to an embodiment. The temperature sensor 406 is configured as a resistance temperature detector electrically coupled with one or more electrical traces. The temperature sensor 406 is configured as a serpentine line disposed on a polymer film. In various embodiments, the serpentine line is electrically coupled with a first electrical trace at a first end of the serpentine line and electrically coupled with a second electrical trace at a second end of the serpentine line. The temperature sensor 406 is connected to one or more sensor terminals 408 that may interface with one or more circuits outside of a battery. In various embodiments, the temperature sensor may be a redundant resistance temperature detector (RTD) having two or more RTDs interwoven to maintain equal temperatures. The redundant RTDs may be used to detect errors in the temperature sensor, for example, disagreement between the two RTDs may be interpreted as a sensor failure and the performance of the battery may be altered to avoid temperature dependent problems with operating the battery. For example, the charging rate may be decreased.

The temperature sensor 406 may be structurally attached to the electrode 402 using heat, for example, ultrasonic bonding, laser welding, and the like. Optionally, the temperature sensor 406 may also be affixed to the electrode 402 using a bonding adhesive. For example, a hot melt film 404 applied to the temperature sensor circuit and the bonding surface of the electrode.

Figure 11:
FIG. 11 illustrates a sensor on a film according to an embodiment.
Figure 12:
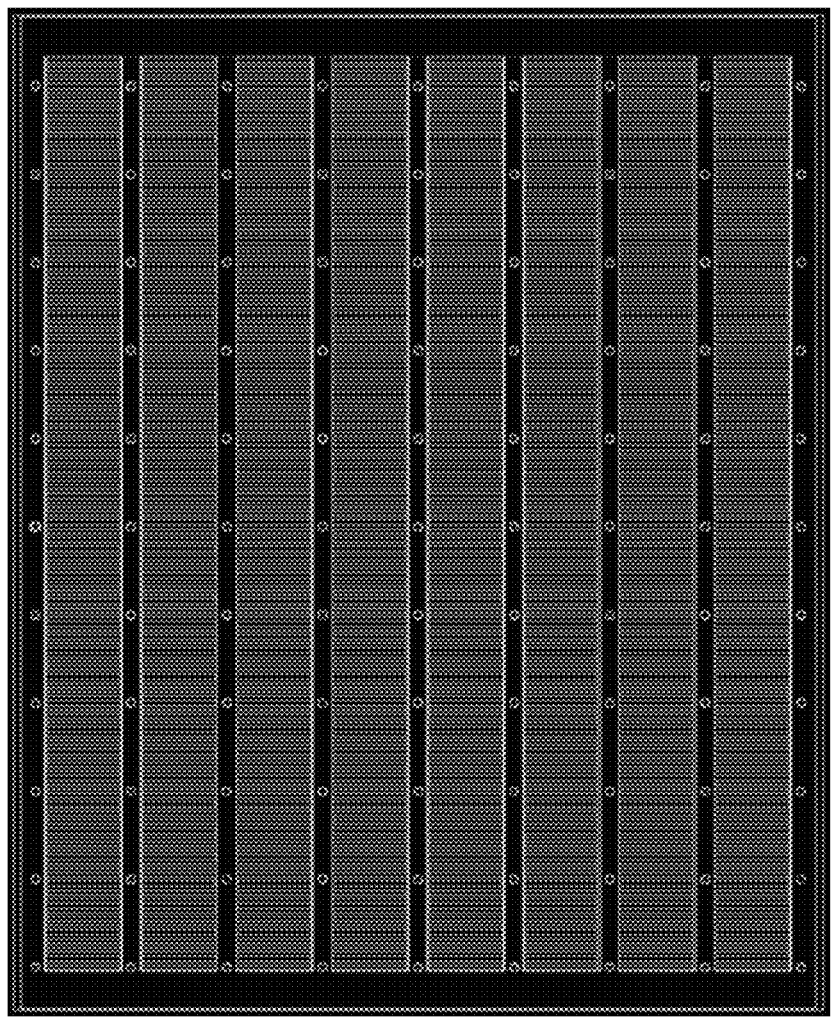
FIG. 12 illustrates a panel of sensors on a film according to an embodiment.
Figure 13:
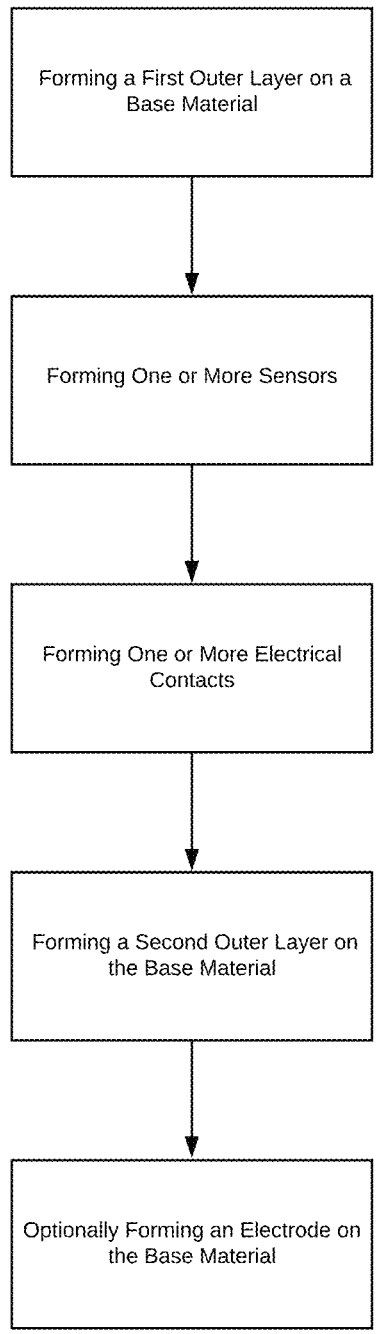
FIG. 13 illustrates flow diagram for a method for forming a sensored electrode tab according to an embodiment.

As shown in FIG. 9, the temperature sensor may be a straight sensor 602 having one or more coplanar sensor terminals affixed to the end of the sensor circuit. To avoid stacking the sensor on the electrode, thereby minimizing any change in electrode thickness as a result of the sensor and/or maximizing sensor density for panel manufacturing arrangements. In various embodiments, the sensor 406 may be configured to be co-planar with electrode 402 and/or structurally independent of the electrode 402. Sensors 406 may be cut from a panel and assembled to the electrode using a hot melt tape. FIG. 12 illustrates a panel of sensors according to some embodiments. Optionally, the sensor may be a stand-alone sensor device independent of the electrode as shown in FIG. 11.

Figure 10:
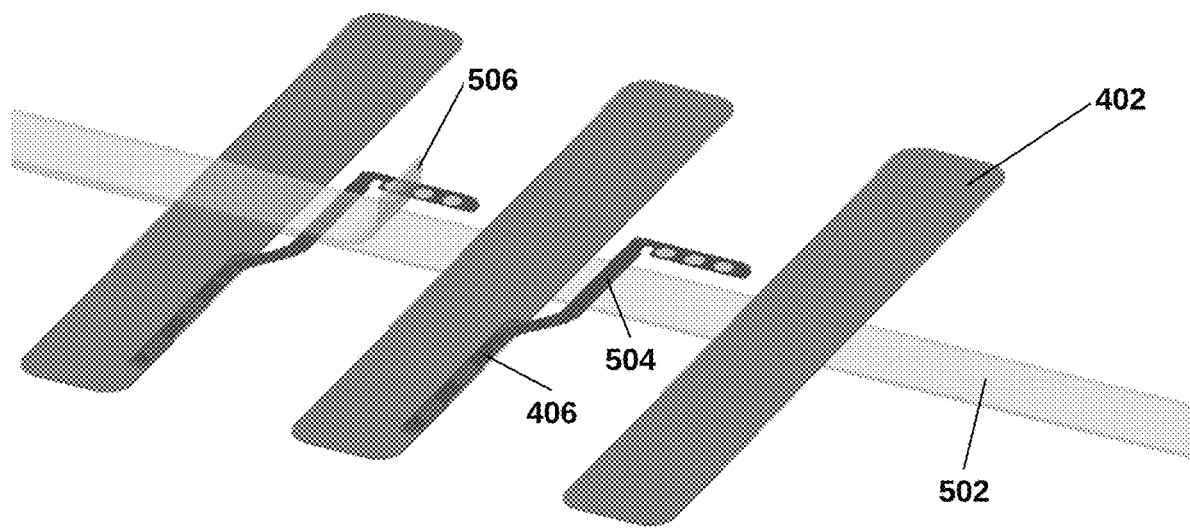
FIG. 10 illustrates an assembly process for forming a sensored electrode tab according to an embodiment.

FIG. 10 illustrates a process for forming the sensored battery tab of FIG. 7. The electrode 402 may be cross fed from a reel in a continuous assembly process. The electrode 402 is cut from a reel and bonded to a first seal tape 502 using heat. A sensor 406 is then placed on the electrode with the temperature sensor over the electrode and the sensor circuit 504 is attached to the first tape using heat. A second layer of seal tape 506 is then fixed to the electrode 402 and the sensor circuit 504 using heat, for example, hot roll lamination. In various embodiments, the first and second layers of seal tape are a 5 millimeters (mm) wide hot melt tape processed in a continuous roll.

Figure 14:
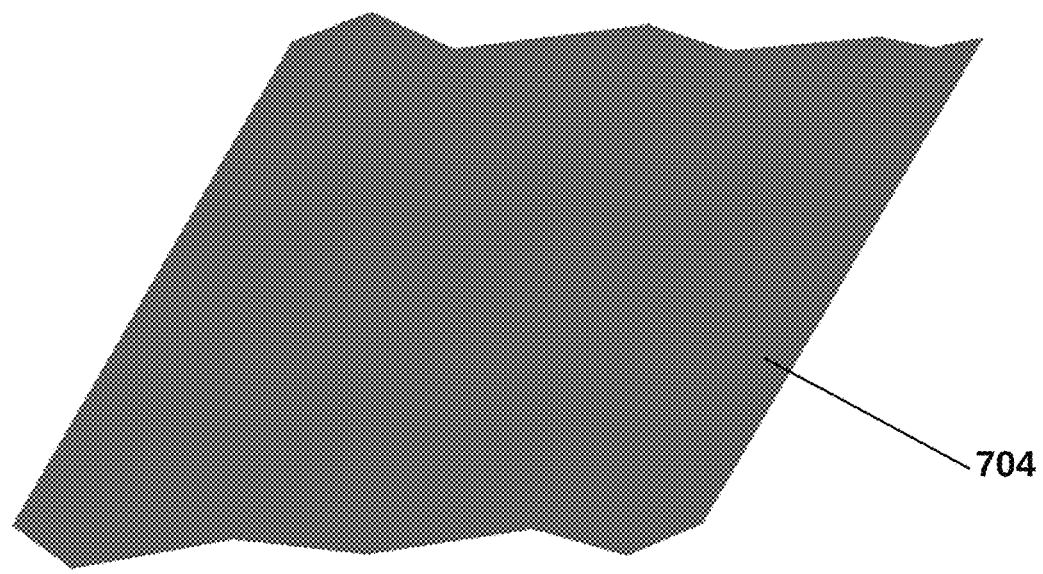
FIG. 14 illustrates a base material for forming a sensored electrode tab according to an embodiment.

FIGS. 13-23 describe a method of forming an anode tab 702 according to some embodiments of the present disclosure. Referring to FIG. 14, a roll of base material 604 is provided. For some embodiments, the base material 604 is a material having higher conductivity than nickel. For some embodiments, the base material 604 is copper foil. For some embodiments, the copper foil has been chromate treated to support direct bonding of a polyimide coating. The copper foil can have a thickness from 20-50 μm. For some embodiments, the copper foil can have a thickness of 35 μm.

Figure 15:
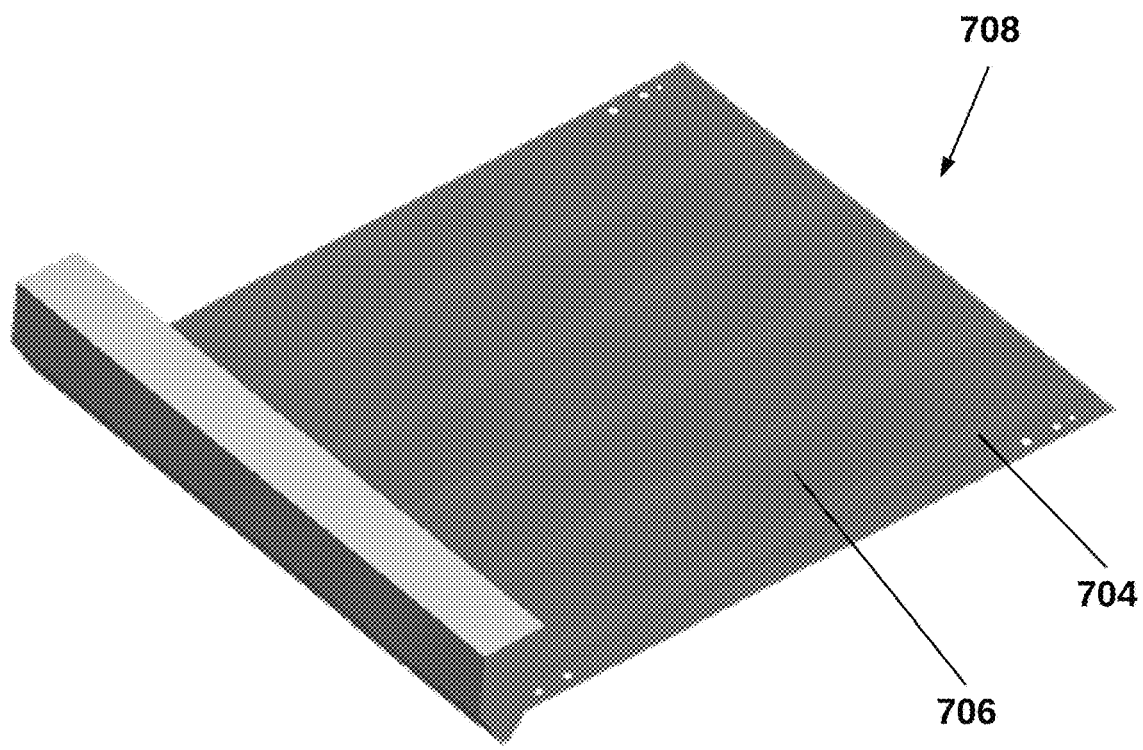
FIG. 15 illustrates a coated substrate for forming a sensored electrode tab according to an embodiment.

FIG. 15 illustrates a dielectric layer, such as a polyimide coating 706, disposed on the base material 704. For some embodiments, the polyimide coating 706 is disposed only on a separator side 708 of the base material 704 and not on a foil side 710 of the base material 704. For some embodiments, the polyimide coating 706 can be applied in a thickness of 5 to 10 μm to minimize thickness of the anode tab 702. The polyimide coating 706 is applied using techniques including, but not limited to, liquid slot die, roller coat, spray, curtain coat, dry film lamination, and screen-printing techniques. For some embodiments, the polyimide coating 706 is applied by liquid slot die deposition. According to some embodiments, the polyimide coating 706 is a photoimageable polyimide and is exposed to ultraviolet (UV) light, developed, and cured.

Figure 16:
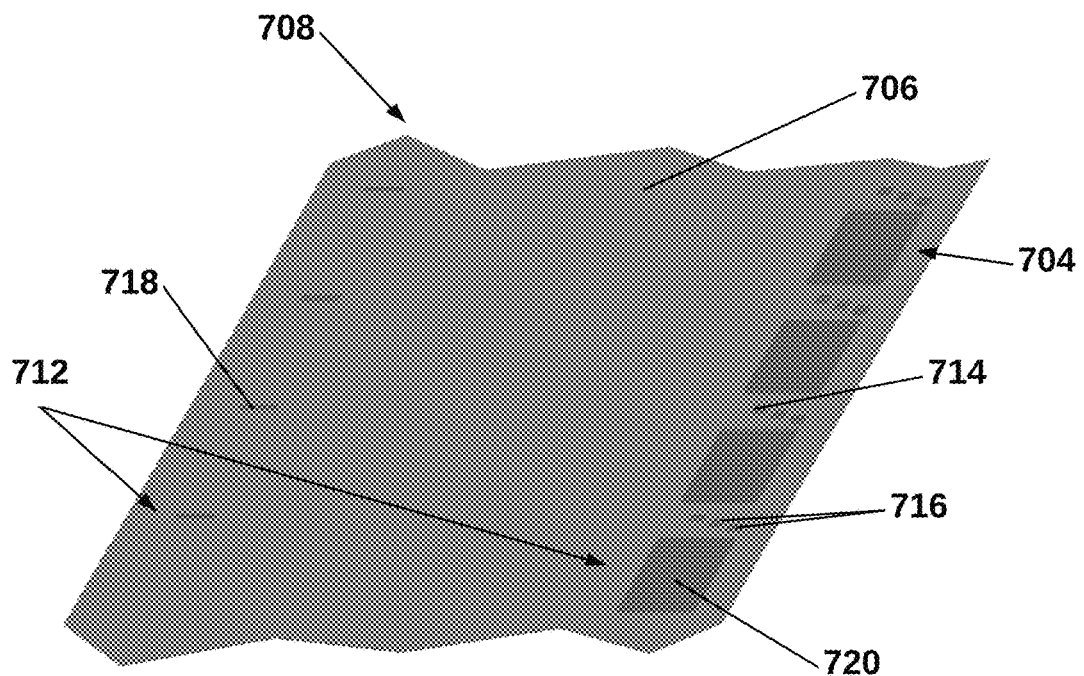
FIG. 16 illustrates a patterned substrate for forming a sensored electrode tab according to an embodiment.

FIG. 16 illustrates the polyimide coating disposed on the separator side 708 of the base material 704 with a pattern 712 etched thereon. The pattern 712 etched on the polyimide coating 706 includes access points to a reference electrode terminal 714, RTD terminals 716, a reference electrode 718, and a main anode terminal 720.

For some embodiments, to form the pattern 712 on the polyimide coating 706, a photoresist layer is formed on the polyimide coating 706. The photoresist layer, according to some embodiments, is exposed using photolithography techniques including those known in the art and developed using wet etch techniques including those known in the art. This patterned photoresist layer then provides the pattern for the polyimide coating 706 during a polyimide removal process (etching), either wet or dry techniques can be used. The photoresist layer can then be stripped by techniques known in the art. Still another patterning method is laser ablation of the unwanted dielectric.

Figure 17:
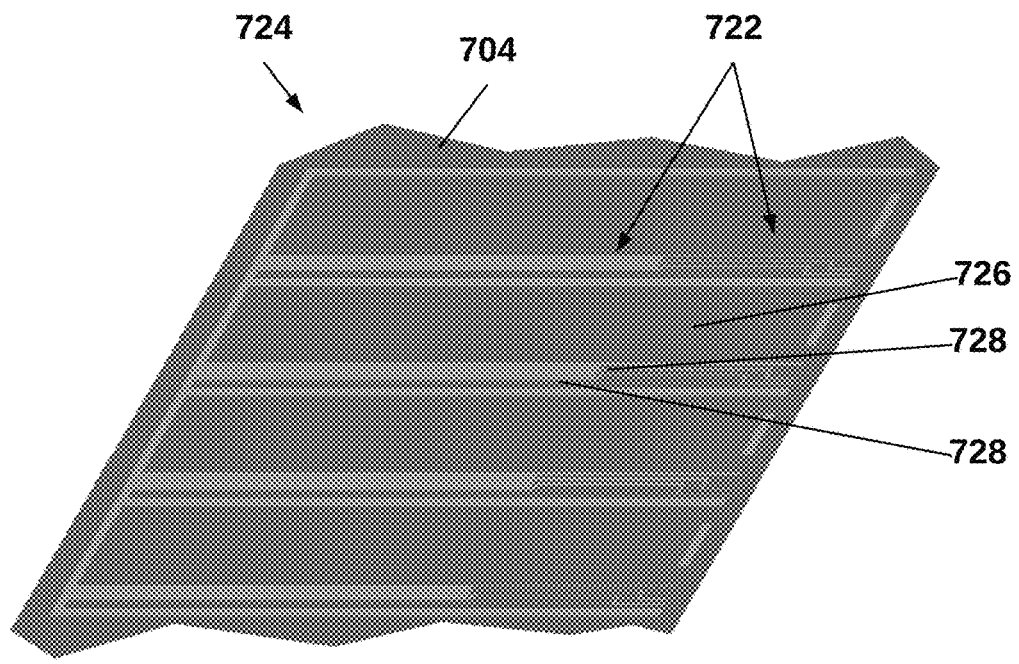
FIG. 17 illustrates a plated substrate for forming a sensored electrode tab according to an embodiment.

FIG. 17 illustrates a pattern 722 etched on the foil side 724 of the base material 704. For some embodiments, the anode tab 702 after the pattern 722 is etched thereon would have a main anode 726, two RTD leads 728, and a reference electrode lead 728.

For some embodiments, to etch the pattern 722 on the foil side 724 of the base material 704, the method further includes coating a resist layer, exposing the resist layer to UV light, developing the resist layer, etching the base material, and stripping the resist layer. A resist coating is applied on the base material 704 using techniques including, but not limited to, liquid slot die, roller coat, spray, curtain coat, dry film lamination, and screen-printing techniques. The resist coating is then exposed to UV light, developed, etched (that is, the base material 704 is etched in regions not protected by the resist pattern), and stripped using photolithography and etching techniques including those known in the art.

For some embodiments, the method further includes micro-etching the anode tab 702 to remove the chromate treatment. Micro-etching can be performed using an oxidative process or by other techniques known in the art.

Figure 18:
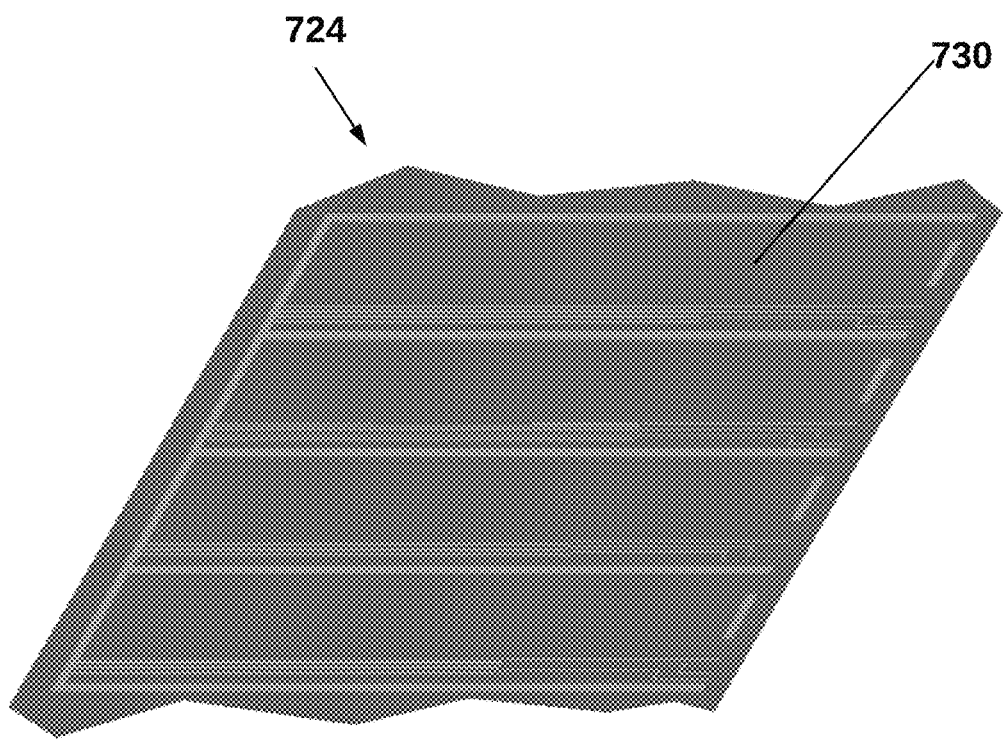
FIG. 18 illustrates a pattern formed on a coated base layer for forming a sensored electrode tab according to an embodiment.

FIG. 18 illustrates a nickel layer 730 disposed over the exposed copper on the foil side 724 of the base material 702. For some embodiments, the method includes sputtering nickel on the foil side 724. For some embodiments, the nickel layer 730 is about 1-5 μm in thickness. Preferably, the nickel layer 730 is about 2 μm in thickness. Sputtering nickel on the foil side 724 can be performed using techniques well-known in the art.

Figure 19:
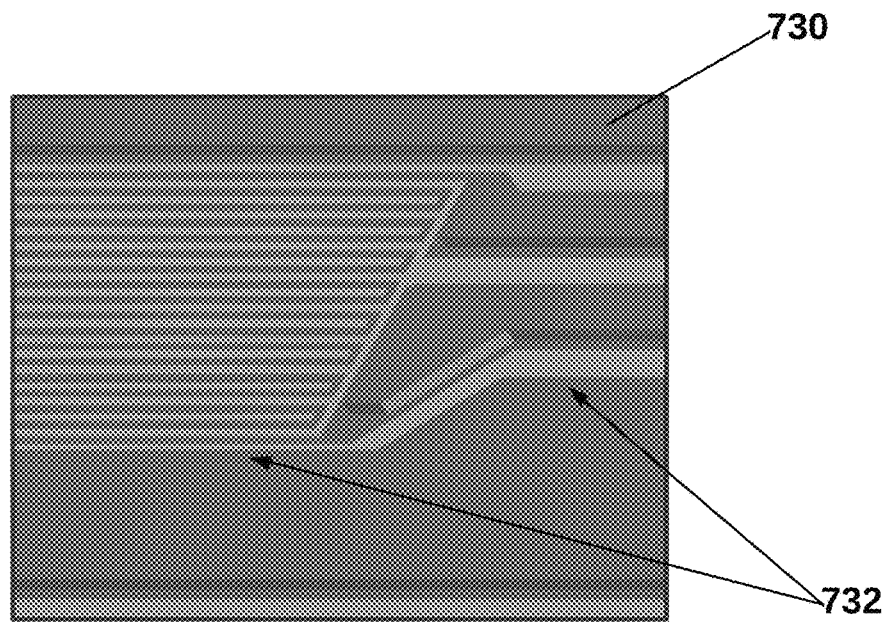
FIG. 19 illustrates a coated substrate for forming a sensored electrode tab according to an embodiment.

FIG. 19 illustrates a pattern 732 etched in the nickel layer 730. For some embodiments, to etch the pattern 732 on the nickel layer 730, the method further includes coating a resist layer, exposing the resist layer to UV light, developing the resist layer, etching the base material, and stripping the resist layer. A resist coating is applied on the nickel layer 730 using techniques including, but not limited to, liquid slot die, roller coat, spray, curtain coat, dry film lamination, and screen-printing techniques. The resist coating is then exposed to UV light, developed, etched (that is, the nickel layer 730 is etched in regions not protected by the resist pattern), and stripped using photolithography and etching techniques including those known in the art.

Figure 20:
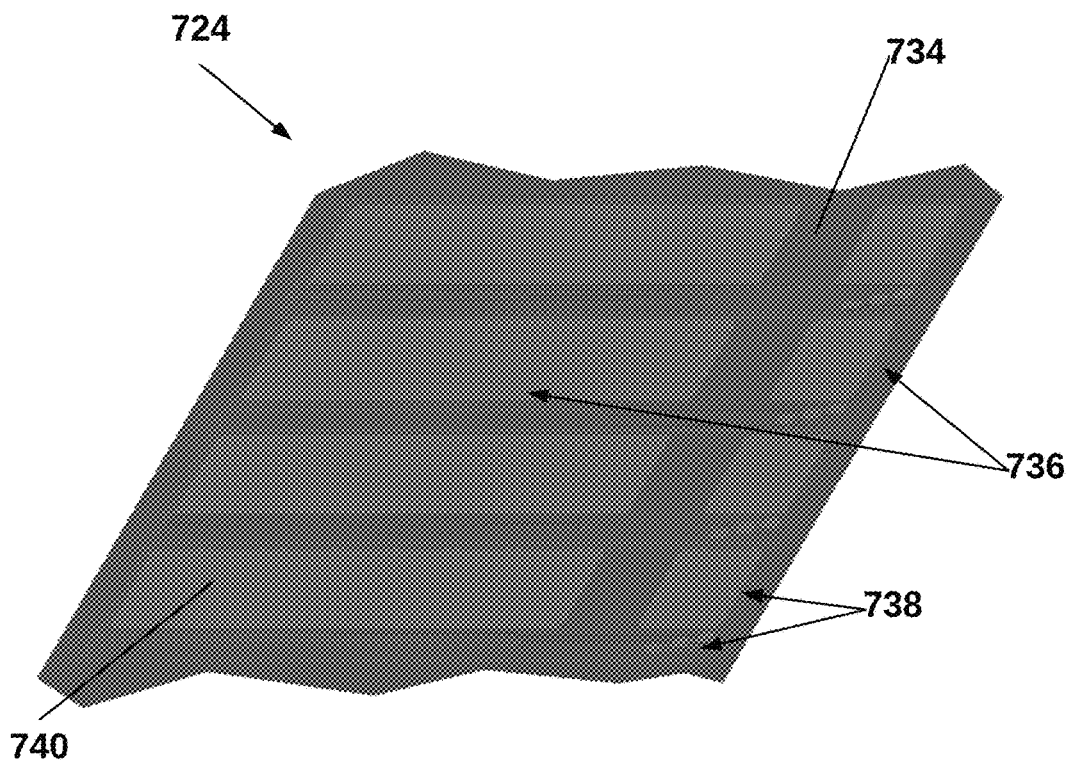
FIG. 20 illustrates a plated substrate for forming a sensored electrode tab according to an embodiment.

FIG. 20 illustrates a second dielectric layer, such as a polyimide layer 734, disposed over the foil side 724 with a pattern 736 etched thereon. For some embodiments, the polyimide coating 734 can be applied in a thickness of 5 to 10 μm to minimize thickness of the anode tab 702. The second polyimide coating 734 is applied using techniques including, but not limited to, liquid slot die, roller coat, spray, curtain coat, dry film lamination, and screen-printing techniques. For some embodiments, the second polyimide coating 46 is applied by liquid slot die. According to some embodiments, the second polyimide coating 734 is a photoimageable polyimide and is exposed to UV light, developed, and cured. The pattern 736 etched on the second polyimide coating 734 includes access points to four pin outs 738 and a main foil attach face 740. The pattern 736 can be etched by techniques discussed in the present disclosure or other techniques known in the art.

Figure 21:
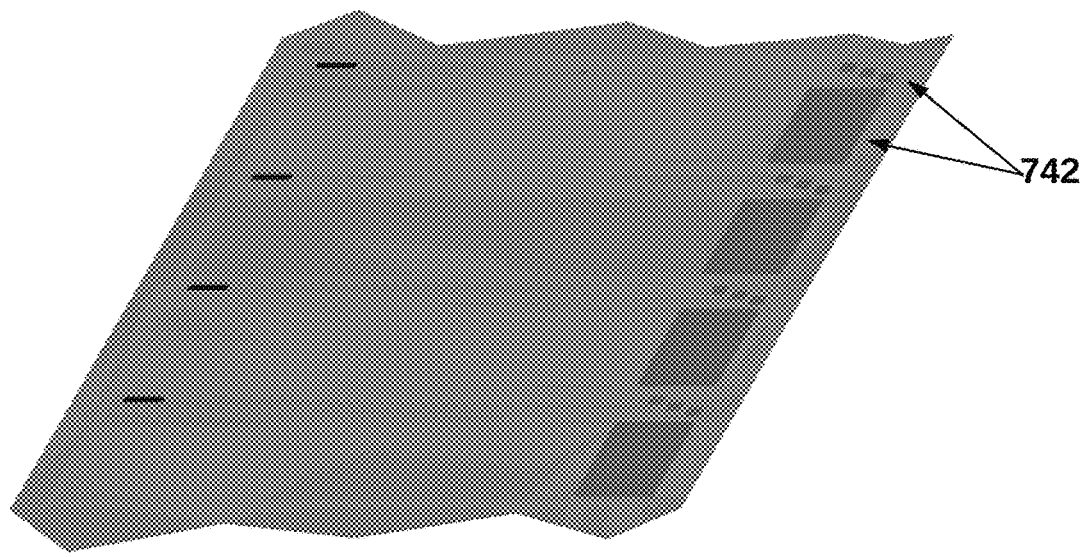
FIG. 21 illustrates a panelized substrate for forming a sensored electrode tab according to an embodiment.

FIG. 21 illustrates an electroplated nickel layer 742 on the anode tab 702. In some embodiments, the method includes electroplating nickel on both sides (i.e., foil side and separator side) of the anode tab 702. For some embodiments, the nickel layer 742 is a soft nickel and covers all the exposed nickel faces of the anode tab 702. For some embodiments, the nickel layer 742 is about 1-5 μm in thickness. Preferably, the nickel layer 742 is about 2-3 μm in thickness. Electroplating nickel on the anode tab 702 can be performed using techniques well-known in the art without a mask.

Figure 22:
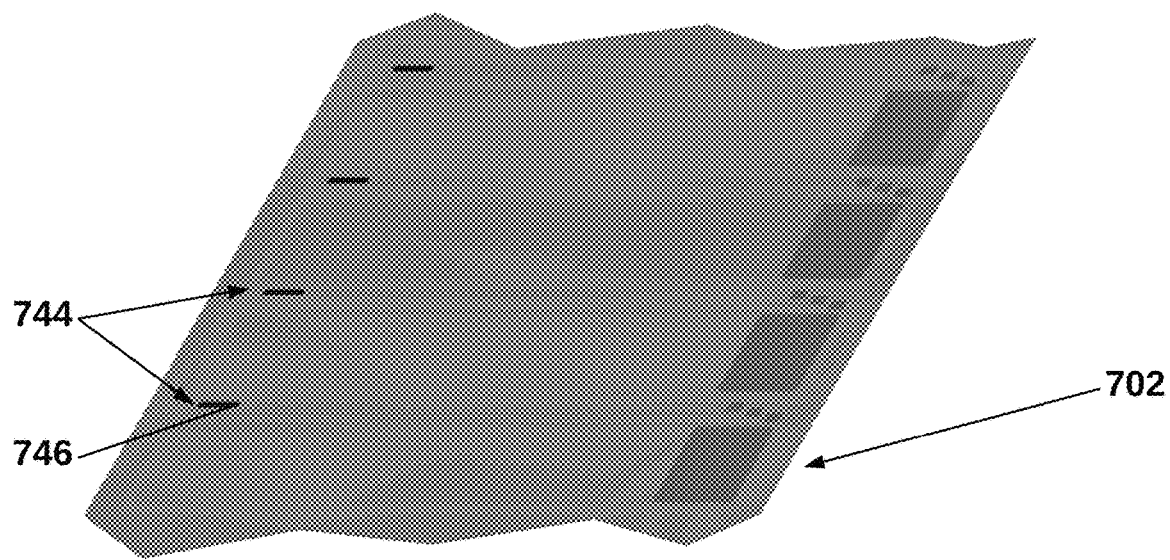
FIG. 22 illustrates a sensored electrode tab according to an embodiment.

FIG. 22 illustrates an anode tab 702 that is panelized, automated optical inspection (AOI) inspected, and defect-marked. Such steps can be performed using techniques well-known in the art.

Further, the method can include selectively applying a reference electrode material 744. For some embodiments, a thin coating of graphite slurry material is selectively applied to exposed reference electrode 746 by means of inkjet, jet, syringe dispense, stencil, and other similar techniques known in the art. The method can also further include baking the anode tab 702 after selectively applying the reference electrode material 744. Baking can be performed in conditions known in the art.

Figure 23:
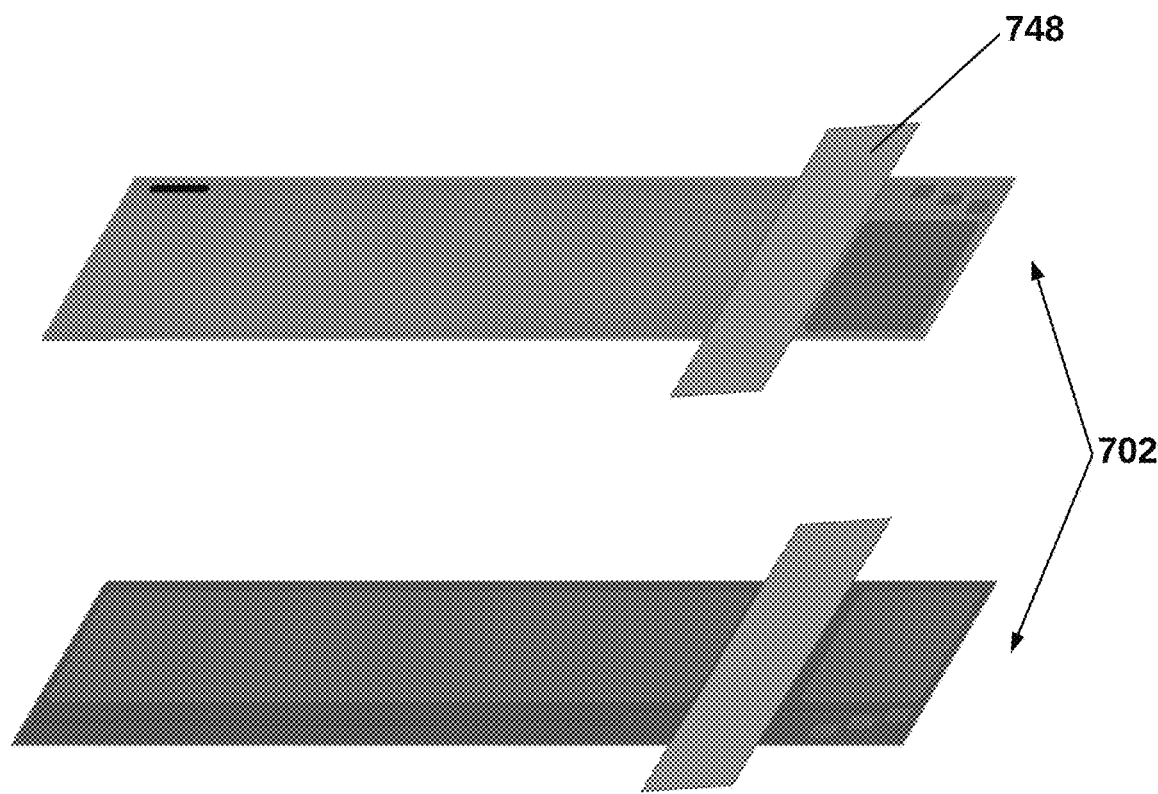
FIG. 23 illustrates a panel of sensored electrode tabs according to an embodiment.

FIG. 23 illustrates an anode tab 702 with a sealant 748 applied thereon on a short axis of the anode tab 702. For some embodiments, the method includes singulating the anode tab 702 and applying a sealant 748 thereon. The sealant 748 can applied along a short axis of the anode tab 702 on a first side and a second side of the anode tab 702. For some embodiments, the sealant 748 is a heat seal tape. Other sealants known in the art can also be used.

A similar method for forming a cathode tab can be performed as the method for forming the anode tab 702. Those skilled in the art would readily understand the modifications to make a cathode tab based on the method for forming the anode tab 702. For example, the RTD would be replaced with a reference electrode and a different slurry material would be applied on the reference electrode, such as a lithium oxide material. For some embodiments, a base layer for a cathode tab is aluminum.

Although described in connection with these embodiments, those of skill in the art will recognize that changes can be made in form and detail without departing from the spirit and scope of the invention.

What is claimed is:

1. An electrode tab comprising:
a base layer including a sensor, a battery electrode terminal, one or more sensor terminals, a reference electrode terminal, and a battery electrode interface,
an outer layer formed over the base layer, the outer layer having access points exposing the battery electrode terminal, the one or more sensor terminals, the reference electrode terminal, and the battery electrode interface, the sensor is a patterned layer on the base layer.

2. The electrode tab of claim 1, wherein the sensor is a resistance temperature detector.

3. The electrode tab of claim 1, wherein the sensor includes an array of resistance temperature detectors.

4. The electrode tab of claim 3, wherein the array of resistance temperature detectors includes two or more redundant resistance temperature detectors placed on the electrode tab.

5. The electrode tab of claim 3, wherein the electrode tab is an anode tab including a reference electrode.

6. The electrode tab of claim 1, wherein the sensor is a pressure sensor.

7. The electrode tab of claim 6, wherein the pressure sensor is a strain gauge.

8. The electrode tab of claim 6, wherein the pressure sensor is a capacitive sensor.

9. The electrode tab of claim 1, wherein the sensor is formed using a coating.

10. The electrode tab of claim 1, wherein the sensor is etched onto a surface of the base layer.

11. The electrode tab claim 1, wherein the electrode tab is a cathode tab including a reference electrode.

12. The electrode tab of claim 1, wherein the sensor includes an array of one or more of any of a resistance temperature detector, a thermocouple, a thermopile, and thermistor.

13. An electrode tab comprising:
a first tape;
a battery electrode bonded to the first tape;
a sensor attached to the battery electrode by the first tape; and
the sensor is a patterned metal layer on a film.

14. The electrode tab of claim 13, wherein the sensor is structurally attached to a surface of the battery electrode.

15. The electrode tab of claim 13, wherein the sensor is electrically coupled to the battery electrode by hot melt tape.

16. The electrode tab of claim 13, wherein the sensor and battery electrode are co-planar.

17. An electrode tab comprising:
an outer layer; and
a base layer having the outer layer formed on the base layer, the base layer including one or more reference electrodes formed on the base layer, the one or more reference electrodes includes a metallic base layer and a coating formed on the metallic base layer, and the outer layer having access points exposing at least one reference electrode terminal for the one or more reference electrodes.

18. The electrode tab of claim 17, wherein the coating is fabricated to chemically match a battery electrolyte.

* * * * *